(12) United States Patent
Tago et al.

(10) Patent No.: US 8,545,716 B2
(45) Date of Patent: Oct. 1, 2013

(54) ETCHING LIQUID COMPOSITION

(75) Inventors: Tsuguhiro Tago, Nagaoka (JP);
Tomotake Matsuda, Taki-gun (JP);
Mayumi Kimura, Matsuzaka (JP);
Tetsuo Aoyama, Ikoma (JP)

(73) Assignees: Hayashi Pure Chemical Ind., Ltd., Osaka-shi, Osaka (JP); Sanyo Electric Co., Ltd., Moriguchi-shi, Osaka (JP); SANYO Semiconductor Manufacturing Co., Ltd., Ojiya-shi, Niigata (JP); Sanyo Semiconductor Co., Ltd., Ora-gun, Gunma (JP)

( * ) Notice: Subject to any disclaimer, the term of this patent is extended or adjusted under 35 U.S.C. 154(b) by 268 days.

(21) Appl. No.: 12/438,143

(22) PCT Filed: Jul. 16, 2008

(86) PCT No.: PCT/JP2008/062837
§ 371 (c)(1),
(2), (4) Date: Feb. 20, 2009

(87) PCT Pub. No.: WO2009/011363
PCT Pub. Date: Jan. 22, 2009

(65) Prior Publication Data
US 2010/0230631 A1 Sep. 16, 2010

(30) Foreign Application Priority Data
Jul. 19, 2007 (JP) .................... 2007-188043

(51) Int. Cl.
*C09K 13/06* (2006.01)
(52) U.S. Cl.
USPC .................... 252/79.4; 252/79.2; 438/689
(58) Field of Classification Search
None
See application file for complete search history.

(56) References Cited

U.S. PATENT DOCUMENTS

| 2,582,020 | A | * | 1/1952 | Emery ..................... 205/646 |
| 4,872,919 | A | * | 10/1989 | Bucher et al. ............... 134/3 |
| 4,895,617 | A | * | 1/1990 | Roche et al. ............... 216/103 |
| 5,464,500 | A | * | 11/1995 | Tsujimura et al. ............ 216/34 |
| 7,259,101 | B2 | * | 8/2007 | Zurcher et al. ............. 438/700 |

(Continued)

FOREIGN PATENT DOCUMENTS

| JP | 4506528 T | 11/1992 |
| JP | 6122982 A | 5/1994 |

(Continued)

*Primary Examiner* — Binh X Tran
*Assistant Examiner* — David Cathey, Jr.
(74) *Attorney, Agent, or Firm* — Ditthavong Mori & Steiner, P.C.

(57) ABSTRACT

A metal film such as an aluminum film or an aluminum alloy film is etched with good controllability, preventing a resist from bleeding, to have a proper taper configuration and superior flatness.

A water solution containing a phosphoric acid, a nitric acid, and an organic acid salt is used as an etching liquid composition used to etch the metal film on a substrate.

The organic acid salt is composed of one kind selected from a group consisting of an aliphatic monocarboxylic acid, an aliphatic polycarboxylic acid, an aliphatic oxicarboxylic acid, an aromatic monocarboxylic acid, an aromatic polycarboxylic acid and an aromatic oxycarboxylic acid, and one kind selected from a group consisting of an ammonium salt, an amine salt, a quaternary ammonium salt, and an alkali metal salt.

In addition, a concentration of the organic acid salt ranges from 0.1% to 20% by weight.

In addition, the etching liquid composition according to the present invention is used when the metal film is formed of aluminum or an aluminum alloy.

2 Claims, 1 Drawing Sheet

(56) References Cited

U.S. PATENT DOCUMENTS

| | | | |
|---|---|---|---|
| 7,390,744 B2* | 6/2008 | Jia et al. | 438/689 |
| 2005/0266695 A1* | 12/2005 | Gonzalez et al. | 438/754 |
| 2006/0094241 A1* | 5/2006 | Park et al. | 438/689 |

FOREIGN PATENT DOCUMENTS

| | | |
|---|---|---|
| JP | 7176525 A | 7/1997 |
| JP | 2001077098 A | 3/2001 |
| JP | 2002075959 A | 3/2002 |
| JP | 2003-013261 A | 1/2003 |
| JP | 2003049285 A | 2/2003 |
| JP | 2004003005 A | 1/2004 |
| JP | 2005085811 A | 3/2005 |
| JP | 2005162893 A | 6/2005 |
| JP | 2006135282 A | 5/2006 |
| JP | 2006344939 A | 12/2006 |
| KR | 10-0465342 B1 | 12/2004 |
| KR | 10-2006-0128210 A | 12/2006 |

* cited by examiner

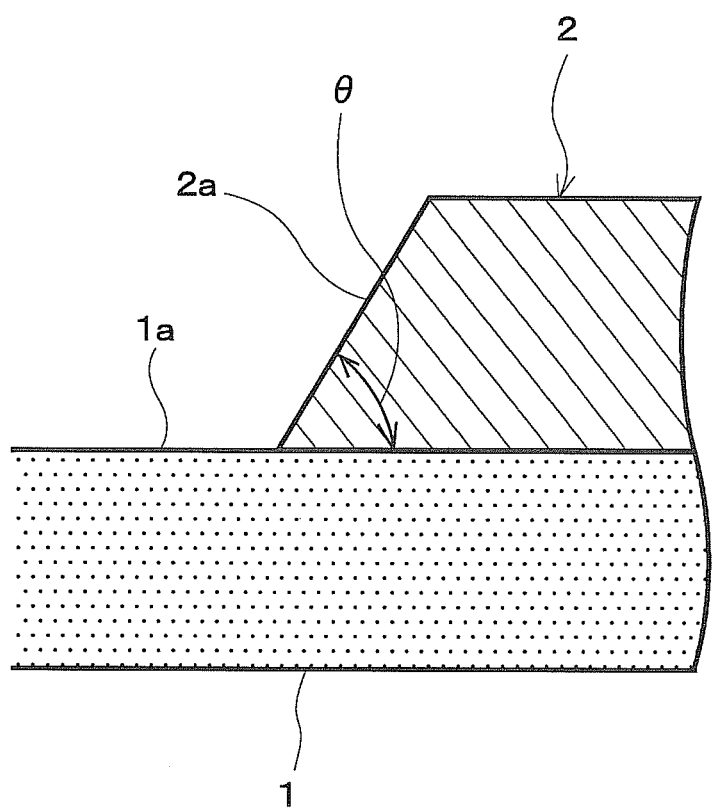

ETCHING LIQUID COMPOSITION

TECHNICAL FIELD

The present invention relates to an etching liquid composition used to etch a metal film such as an aluminum film and an aluminum alloy film to form a wiring of an electronic component, for example, and more particularly, to an etching liquid composition used to etch a metal film such as an aluminum film and an aluminum alloy film provided on a substrate to constitute a semiconductor device and a liquid crystal display device.

BACKGROUND ART

Conventionally, in various kinds of electronic components, the following etching method has been known as a method for forming a wiring and an electrode on a surface of a semiconductor substrate or a glass substrate.

First, an aluminum film or an aluminum alloy film serving as a material of the wiring and the electrode (base material) is formed on the substrate. Then, a photosensitive resin is applied onto the surface by a photolithography method, and exposure and development are performed to form a pattern mask.

Then, the aluminum film or the aluminum alloy film is etched by use of the pattern mask. Thus, the wiring and the electrode having a desired pattern can be formed on the aluminum film or the aluminum alloy film.

By the way, according to the semiconductor device and the liquid crystal display device, the wiring and the electrode provided in the above device are strongly required to be miniaturized and have a high performance in recent years as a product is increasingly required to be miniaturized and have high performance. Thus, accordingly, in a technical field in which multiple stratification has been progressed, in order to respond to the multiple stratification, it is strongly desired to control a sectional shape of the wiring to have a configuration (forward tapered configuration) in which an angle (referred to as the taper angle hereinafter) formed between a side surface of the etched wiring and a surface of a base material (an insulation layer or a substrate, for example) is less than 90°.

Thus, since the wiring material has to be low in resistance along with the high density and miniaturization of the pattern in recent years, aluminum or an aluminum alloy is widely used.

In addition, when the multilayered wiring is installed, aluminum or the aluminum alloy is used as a material of a lower-layer wiring to reduce a signal delay. Then, in order to electrically insulate an upper-layer wiring from the lower-layer wiring, an insulation layer is formed on the lower-layer aluminum wiring or aluminum alloy wiring by some sort of method, and then, an aluminum wiring or aluminum alloy wiring is formed thereon as the upper-layer wiring.

Here, it is necessary to control a sectional configuration of the wiring of the lower-layer aluminum wiring or aluminum alloy wiring to have the forward tapered configuration in order to improve the coverage of the insulation layer formed thereon.

In this case, as the controllability of the sectional configuration of the lower-layer aluminum wiring or aluminum alloy wiring is important, when the sectional configuration of the wiring cannot be the forward tapered configuration or when the taper angle θ of the wiring is out of a desired range, the upper-layer aluminum wiring or aluminum alloy wiring could be disconnected or the upper-layer wiring and the lower-layer wiring could be shorted electrically through a crack generated in the insulation layer, and the problem is that reliability is lowered.

By the way, in the case where the wiring having the tapered configuration is formed by etching, the wiring having the forward tapered configuration can be formed by etching the aluminum film or aluminum alloy film by use of a water solution of a phosphoric acid/a nitric acid/an acetic acid as an etching liquid in general.

For example, when the etching is performed by use of a mixture liquid in which a volume ratio of the phosphoric acid:the nitric acid:the acetic acid:water is 16:2 to 8:2:1 with a mask having superior adhesiveness with the metal film that is formed in such a way that a resist as the mask is exposed and developed to be patterned into a predetermined wiring configuration and then baked (post-baking operation) at a baking temperature at which the sufficient adhesiveness with the metal film can be provided, the angle (taper angle) θ formed between the side surface of the wiring and the base material (such as the insulation layer or the substrate) on which the wiring is formed is close to 90° (perpendicular) without exceeding 90°.

However, when the baking temperature is lower than the appropriate temperature, since the adhesiveness of the mask with the metal film is insufficient, the etching liquid enters into an interface between the resist and the metal film. As a result, since the metal film is etched from its upper surface also, it is reported that the angle formed between the side surface of the wiring and the upper surface of the wiring is increased, and the wiring having a one-stage tapered configuration in which the side surface of the wiring is moderately sloped is formed. When the concentration of the nitric acid is additionally increased in the etching liquid, it is reported that the taper angle is decreased (refer to patent document 1).

Meanwhile, the concentration of the nitric acid is low, a one-stage tapered configuration having a large taper angle is formed, but when the concentration of the nitric acid is increased, the etching rate of the interface between the resist and the metal film is increased, so that the wiring has a two-stage forward tapered configuration having a first stage having a small taper angle formed on the interface side between the resist and the metal film and a second stage having a large taper angle formed on the side closer to the substrate. When the concentration of the nitric acid is additionally increased, the wiring having a one-stage forward tapered configuration having a small inclination is formed (refer to patent document 2 and a patent document 3).

However, when the concentration of the nitric acid is increased in the etching liquid, although the etching rate of the aluminum film or the aluminum alloy film is increased, the controllability of the etching is lowered and it is difficult to provide the wiring having the tapered configuration with high controllability.

In addition, when the concentration of the nitric acid is high in the etching liquid as a mixture of the phosphoric acid/the nitric acid/the acetic acid/water, although it is recognized that the resist is damaged by the nitric acid and the crack is generated in the resist surface, the crack is limited to the resist surface and it is reported that an etching notch is not recognized in the metal surface (refer to the patent document 2).

Furthermore, it is reported that the contraction of the resist due to the etching liquid is not progressed beyond a certain level (refer to the patent document 3).

However, in the case where the concentration of the nitric acid is high, when the resist surface is observed by a scanning electron microscope (SEM) after the etching, it is confirmed that the resist surface is cracked, and the etching trace due to the bleeding of the etching liquid (referred to as the "resist bleeding" hereinafter) is generated in the interface between the resist and the metal film inside the etched surface, that is, in the place in which the etching is not performed. Thus, when the phenomenon of the resist bleeding is generated, the metal film surface covered with the resist is etched and becomes uneven, and the problem is that the desired configuration cannot be provided.

In addition, it is required to find a method for forming a high-quality metal film having a flat and smooth film surface with no surface roughness after the etching along with the miniaturization of a semiconductor process. As an attempt to improve the condition of the metal film surface after the etching by adding an additive agent to the etching liquid, for example, an etching liquid composition in which a trialkylamine oxide surface-active agent is added to an etching liquid containing the phosphoric acid/the nitric acid/the acetic acid/water as its main components is proposed to prevent the etching from being hindered and the smoothness of the etched surface from being damaged due to bubbles attached onto the metal film surface in the etching process, and to prevent hydrogen generated when the metal film is etched by the nitric acid, from attaching on the metal film surface (in a patent document 4, for example). In addition, in order to improve fine processability of the etching liquid, it is known that a surface-active agent is added to improve wetting properties (in a patent document 5, for example).

However, according to the patent documents 4 and 5, an idea to form the metal film having the tapered configuration having the high-quality metal surface superior in smoothness with no surface roughness is not disclosed in particular.

In addition, an etching liquid to which alkyl sulfuric acid ester or a perfuluoroalkenyl phenyl ether sulfonic acid and a surface-active agent as their salt is added to an etching liquid containing the phosphoric acid/the nitric acid/the acetic acid/water as its main components is disclosed (in a patent document 6). However, according to the technique disclosed in the patent document 6, since the surface-active agent is used, and the surface-active agent contains its solvent, the surface-active agent and the solvent are oxidized by the etching liquid, and the problem is that the composition of the etching liquid is likely to be changed and the etching rate is also changed.

Furthermore, although there is a description about a low taper angle (not more than 20°), there is almost no description about a method for controlling the tapered configuration to be a desired configuration and measures against the resist bleeding.

As described above, it is required to provide the etching liquid composition capable of controlling the taper angle with high accuracy, and forming the metal film having the forward tapered configuration having the high-quality etched surface having a superior flatness and smoothness properties with no resist bleeding and no surface roughness.

Patent Document 1:
Japanese Unexamined Patent Publication No. 7-176525
Patent Document 2:
Japanese Unexamined Patent Publication No. 6-122982
Patent Document 3:
Japanese Unexamined Patent Publication No. 2001-77098
Patent Document 4:
Translation of PCT Application No. 4-506528
Patent Document 5:
Japanese Unexamined Patent Publication No. 2003-49285
Patent Document 6
Japanese Unexamined Patent Publication No. 2005-162893

DISCLOSURE OF THE INVENTION

The present invention was made to solve the above problems and it is an object of the present invention to provide an etching liquid composition capable of etching a metal film and particularly an aluminum or aluminum alloy film with good controllability without generating resist bleeding, and capable of forming a metal film having a proper tapered configuration and superior flatness and smoothness properties to provide a highly-reliable semiconductor device, preventing an upper-layer wiring of the semiconductor device having multilayered wirings, from being disconnected and shorted electrically to boost yield.

In order to solve the above problems, the inventors invented the following etching liquid composition through keen examinations.

More specifically, the etching liquid composition according to the present invention is for etching a metal film on a substrate, and it is a water solution containing a phosphoric acid, a nitric acid, and an organic acid salt.

In addition, according to the etching liquid composition in the present invention, as the organic acid salt, it is preferable to be composed of one kind selected from a group consisting of an aliphatic monocarboxylic acid, an aliphatic polycarboxylic acid, an aliphatic oxicarboxylic acid, an aromatic monocarboxylic acid, an aromatic polycarboxylic acid, and an aromatic oxycarboxylic acid, and one kind selected from a group consisting of an ammonium salt, an amine salt, a quaternary ammonium salt, and an alkali metal salt.

In addition, according to the etching liquid composition in the present invention, it is preferable that a concentration of the organic acid salt is 0.1% to 20% by weight.

Furthermore, the etching liquid composition in the present invention is preferably used when an aluminum film or an aluminum alloy film as the metal film is etched.

When the etching liquid composition according to the present invention is used when the metal film is etched, the etching rate can be controlled. As a result, when the metal film is etched by use of the etching liquid composition according to the present invention, the configuration of the metal film after the etching is controlled and a wiring and an electrode having a desired tapered configuration can be formed.

When the organic acid salt is composed of one kind selected from the group consisting of the aliphatic monocarboxylic acid, the aliphatic polycarboxylic acid, the aliphatic oxicarboxylic acid, the aromatic monocarboxylic acid, the aromatic polycarboxylic acid, and the aromatic oxycarboxylic acid, and one kind selected from the group consisting of the ammonium salt, the amine salt, the quaternary ammonium salt, and the alkali metal salt, the configuration of the metal film after the etching can be controlled and the wiring and electrode having the desired tapered configuration can be surely formed.

In addition, according to the etching liquid composition in the present invention, when the concentration of the organic acid salt is limited to 0.1% to 20% by weight, the configuration of the metal film after the etching can be controlled and the wiring and electrode having the desired tapered configuration can be surely formed.

Furthermore, when the metal film formed of aluminum or an aluminum alloy is etched by use of the etching liquid composition in the present invention, the etching rate and the configuration after the etching can be surely controlled. Thus, as a result, the wiring and the electrode each having the intended taper angle and the stabled tapered configuration can be provided.

Furthermore, the etching liquid composition of the metal film according to the present invention is characterized in that the resist bleeding is not generated even when the concentration of the nitric acid is high.

Furthermore, according to the etching liquid composition in the present invention, even when the concentration of the nitric acid is high, the number of cracks recognized in the resist surface after the etching can be reduced as compared with the case where the conventional etching liquid is used, so that the resist can be prevented from deteriorating.

In addition, when the etching liquid composition of the metal film in the present invention is used, even when the taper angle is small, the etched surface formed after the metal film is etched can be a flat surface without any surface roughness.

In addition, according to the etching liquid composition in the present invention, since the surface-active agent and the organic solvent used as the solvent of the surface-active agent itself are not contained, the composition of the etching liquid is prevented from being changed and the etching rate is prevented from being changed, so that an usable time of the etching liquid (chemical liquid life) can be elongated.

In addition, when the etching is performed by use of the etching liquid composition in the present invention, the taper angle can be prevented from being fluctuated due to a chemical liquid process temperature and a process time in a pre-process of the resist patterning.

BRIEF DESCRIPTION OF DRAWINGS

FIG. 1 is a view to explain a taper angle of a metal film (aluminum film) formed by use of an etching liquid composition according to the present invention.

| EXPLANATION OF REFERENCES | |
|---|---|
| 1 | SUBSTRATE |
| 1A | SUBSTRATE SURFACE |
| 2 | ALUMINUM FILM |
| 2A | SIDE SURFACE OF ALUMINUM FILM |
| θ | TAPER ANGLE |

BEST MODE FOR CARRYING OUT THE INVENTION

An embodiment of the present invention will be described hereinafter.

A preferable concentration of a phosphoric acid in an etching liquid composition according to the present invention is 30% to 80% by weight, and more preferably 40% to 70% by weight.

In addition, a preferable concentration of a nitric acid in the etching liquid composition according to the present invention is 1% to 40% by weight, and more preferably 5% to 30% by weight.

In addition, an organic acid salt used in the etching liquid composition according to the present invention includes pairs of acids such as an aliphatic monocarboxylic acid, an aliphatic polycarboxylic acid, an aliphatic oxycarboxylic acid, an aromatic monocarboxylic acid, an aromatic polycarboxylic acid, and an aromatic oxycarboxylic acid, and salts such as an ammonium salt, an amine salt, a quaternary ammonium salt, and an alkali metal salt.

More specifically, as an organic acid constituting the above organic acid salt, the aliphatic monocarboxylic acid includes a formic acid, an acetic acid, a propionic acid, a butyric acid, an isobutyric acid, a valeric acid, an isovaleric acid, a trimethylacetic acid, and a caproic acid, the aliphatic polycarboxylic acid includes an oxalic acid, a malonic acid, a succinic acid, a glutaric acid, an adipic acid, a pimelic acid, a suberic acid, a maleic acid, a fumaric acid, a citraconic acid, an itaconic acid, and a glutaconic acid, the aliphatic oxycarboxylic acid includes a glycolic acid, a lactic acid, a malic acid, tartaric acid, and a citric acid, the aromatic monocarboxylic acid includes a benzoic acid, a toluic acid, and a naphthoic acid, the aromatic polycarboxylic acid includes a phthalic acid, and a trimellitic acid, and the aromatic oxycarboxylic acid includes a salicylic acid and a gallic acid.

In addition, with respect to the above-described organic acids, the above organic salt includes the ammonium salt and the amine salt such as methylamine, dimethylamine, trimethylamine, ethylamine, diethylamine, triethylamine, propylamine, dipropylamine, tripropylamine, butylamine, dibutylamine, tributylamine, monoethanolamine, diethanolamine, triethanolamine, 2-(2-aminoethoxy)ethanol, N-methylethanolamine, N-ethylethanolamine, N,N-dimethylethanolamine, N, N-diethylethanolamine, N,N-diethylethanolamine, hydroxylamine, N, N-diethylhydroxylamine, ethylenediamine, propylenediamine, trimethylenediamine, tetramethylenediamine, pyrrole, pyrroline, pyrrolidine, and morpholine, the quaternary ammonium salt such as a tetramethylammonium hydroxide, a tetraethylammonium hydroxide, and a trimethyl (2-hydroxyethyl)ammonium hydroxide, and the alkali metal salt such as natrium and kalium.

The more preferable organic acid salt according to the present invention includes the pair of the ammonium salt and the aliphatic monocarboxylic acid such as ammonium formate, ammonium acetate, ammonium propionate, ammonium butyrate, ammonium isobutyrate, ammonium valerate, ammonium isovalerate, ammonium trimethylacetate, and ammonium caproate. The above organic acid salt is easily available, soluble, and handled.

The concentration of the organic acid salt used in the present invention is preferably within a range of 0.5% to 30% by weight and more preferably 1% to 20% by weight in order to control an etching rate satisfactorily, prevent resist bleeding from being generated, and form a wiring and an electrode each having a stable tapered configuration.

Working Example

The characteristics of the present invention will be described in detail with reference to working examples of the present invention hereinafter. However, the present invention is not limited only to the following working examples.

<Adjustment of Etching Liquid Composition According to Working Examples of the Present Invention>

The etching liquid compositions (working examples 1 to 6) satisfying the necessary conditions of the present invention were adjusted by combining the phosphoric acid, the nitric acid, the organic acid salt, and water at the rates shown in Table 1.

[Table 1]

In addition, etching liquid compositions (comparative examples 1 to 7) not satisfying the necessary conditions of the present invention were adjusted by combining the phosphoric acid, the nitric acid, the acetic acid as the organic acid, and water at the rates shown in Table 2.

[Table 2]

In addition, the etching liquid compositions of the comparative examples 1 to 7 are outside the scope of the present invention because they do not contain the organic acid salt although they contain the phosphoric acid, the nitric acid, and the acetic acid as organic acids, and water as shown in Table 2.

Here, it is to be noted that triethanolamine alkyl sulfate (alkyl carbon number 12 to 14) serving as an anionic surface-active agent is added to the comparative example 6 as the surface-active agent among the comparative examples 1 to 7.

A metal film was etched by the following method in each of the etching liquid compositions shown in Tables 1 and 2 and measurement and observation were carried out as follows to evaluate their characteristics.

<Measurement of Etching Rate of Aluminum Film>

An aluminum film was formed on a substrate (Si substrate) by a sputtering method to have a film thickness of 400 nm.

Then, a resist was applied on the aluminum film having a thickness of 400 nm formed on the substrate to form a resist pattern.

Then, the substrate was soaked and etched in the etching liquid compositions shown in Tables 1 and 2 under a temperature condition of 40° C. for several minutes (so as to be able to measure the etching rate).

After the etching, the substrate was washed with water and dried and the resist was removed and then an etching amount was measured by a stylus-type film thickness meter to find the etching rate.

<Measurement of Taper Angle of Aluminum Film>

An aluminum film was formed on a substrate (Si substrate) by a sputtering method to have a film thickness of 400 nm.

Then, a resist was applied on the aluminum film and a resist pattern was formed through exposure and development.

Then, the substrate on which the resist pattern was formed was soaked in the etching liquid under a temperature condition of 40° C. for 1.1 times as long as a just etching time calculated from the etching rate.

Then, the substrate was washed with water and dried and the resist was removed and then an etching condition of the aluminum film was observed by a scanning electron microscope (SEM), and a taper angle of the aluminum film having a tapered configuration formed by the etching was measured.

In addition, as shown in FIG. 1, the taper angle used in this specification designates an angle θ formed between a side surface 2a of an aluminum film 2 formed on a substrate 1 and a surface 1a of the substrate 1 on which the aluminum film 2 is formed.

<Observation of Surface Roughness and Resist Bleeding of Etched Surface of Aluminum Film>

An aluminum film was formed on a substrate (Si substrate) by a sputtering method to have a film thickness of 400 nm.

Then, a resist was applied on the aluminum film and a resist pattern was formed through exposure and development.

Then, the substrate on which the resist pattern was formed was soaked in the etching liquid under a temperature condition of 40° C. for 1.1 times as long as a just etching time calculated from the etching rate.

Then, the substrate was washed with water and dried and the resist was removed and then surface roughness and resist bleeding of the etched surface of the aluminum film were observed by a scanning electron microscope (SEM).

The results of the measurement of the taper angle, and the observation of the surface roughness, and resist bleeding carried out for samples (working examples 1 to 6 shown in Table 1) are shown in Table 1.

In addition, similarly, the results of the measurement of the taper angle, and the observation of the surface roughness, and the resist bleeding carried out for samples (comparative examples 1 to 7) are shown in Table 2.

In addition, in the evaluation of the surface roughness and resist bleeding in Tables 1 and 2, ○ is marked when no defect is recognized, Δ is marked when a defect is recognized a little, X is marked when a defect is recognized, and XX is marked when a terrible defect is recognized.

As shown in Table 1, when the aluminum film was etched in the etching liquid compositions of the working examples 1 to 6 in which the phosphoric acid, the nitric acid, the organic acid salt, and water were combined, an optional taper angle was provided, and a smooth etched surface having no surface roughness and resist bleeding was provided.

In addition, it has been found that each of the taper angles of the samples of the working examples 1 to 6 in Table 1 is close to a target value, and the metal film (aluminum film) having the desired taper angle can be provided by adjusting the composition of the etching liquid composition and the etching condition.

As a result, according to the etching liquid composition satisfying the necessary conditions of the present invention, it has been confirmed that the metal film such as the aluminum film can be etched with high controllability without generating resist bleeding, and the metal having the appropriate taper angle, and superior flatness and smoothness can be provided.

Meanwhile, as shown in Table 2, when the etching was performed in the etching liquid compositions according to the comparative examples 1 to 5 and 7 in which the organic acid (acetic acid) was contained but the organic acid salt was not contained, it was difficult to control the taper angle, so that the optional taper angle was not provided, the surface roughness was generated, and distinguished resist bleeding was recognized.

In addition, when the etching was performed in the etching liquid composition according to the comparative example 6 in which the surface-active agent was added to the water solution containing the phosphoric acid, the nitric acid, and the acetic acid, although the taper angle of 20° was provided, the etching rate was low and the surface roughness and the resist bleeding were recognized.

Since the significance of the etching liquid composition according to the present invention is evident from the comparison between the samples of the above working examples and the samples of the comparative examples, it can be understood that the etching can be performed with high efficiency and high accuracy by use of the etching liquid composition according to the present invention.

In addition, although the description has been made of the case where the metal film is the aluminum film in the above working examples, the present invention can be applied to a case where an aluminum alloy film is etched.

The present invention is not limited to the above working examples in other respects, and various applications and variations can be added to the kind of the organic acid salt, the combination ratio of the components, the etching condition such as the temperature and the time, and the thickness and the installation of the metal film within the scope of the present invention.

INDUSTRIAL APPLICABILITY

As described above, the metal film can be etched to have the desired tapered configuration with high controllability by use of the etching liquid composition in the present invention.

In addition, the etched surface can be smooth with no surface roughness, and the resist bleeding can be prevented from being generated.

Therefore, the present invention can be widely applied to a technical field of the multilayered wiring in which a wiring film and an electrode each having low resistance and a forward tapered configuration are needed, that is, a technical field in which a pattern is required to be highly densified and miniaturized.

TABLE 1

| | PHOSPHORIC ACID (% BY WEIGHT) | NITRIC ACID (% BY WEIGHT) | ORGANIC ACID SALT KIND | ORGANIC ACID SALT (% BY WEIGHT) | WATER (% BY WEIGHT) | ETCHING RATE (NM/MIN) | TAPER ANGLE (°) | SURFACE ROUGHNESS | RESIST BLEEDING |
|---|---|---|---|---|---|---|---|---|---|
| WORKING EXAMPLE1 | 57.9 | 21.1 | AMMONIUM ACETATE | 2.0 | 19.0 | 378 | 30 | ○ | ○ |
| WORKING EXAMPLE2 | 57.0 | 20.7 | AMMONIUM ACETATE | 3.5 | 18.8 | 336 | 40 | ○ | ○ |
| WORKING EXAMPLE3 | 56.2 | 20.4 | AMMONIUM ACETATE | 5.0 | 18.4 | 312 | 50 | ○ | ○ |
| WORKING EXAMPLE4 | 54.3 | 19.9 | AMMONIUM ACETATE | 8.0 | 17.8 | 288 | 70 | ○ | ○ |
| WORKING EXAMPLE5 | 57.9 | 21.1 | AMMONIUM CITRATE | 2.0 | 19.0 | 360 | 40 | ○ | ○ |
| WORKING EXAMPLE6 | 57.9 | 21.1 | AMMONIUM LACTATE | 2.0 | 19.0 | 396 | 45 | ○ | ○ |

TABLE 2

| | PHOSPHORIC ACID (% BY WEIGHT) | NITRIC ACID (% BY WEIGHT) | ACETIC ACID | SURFACE-ACTIVE AGENT (% BY WEIGHT) | WATER (% BY WEIGHT) | ETCHING RATE (NM/MIN) | TAPER ANGLE (°) | SURFACE ROUGHNESS | RESIST BLEEDING |
|---|---|---|---|---|---|---|---|---|---|
| COMPARATIVE EXAMPLE1 | 57.9 | 21.1 | 2.0 | — | 19.0 | 396 | 13 | X | X X |
| COMPARATIVE EXAMPLE2 | 57.0 | 20.7 | 3.5 | — | 18.8 | 378 | 13 | X | X X |
| COMPARATIVE EXAMPLE3 | 56.2 | 20.4 | 5.0 | — | 18.4 | 366 | 14 | X | X X |
| COMPARATIVE EXAMPLE4 | 54.3 | 19.9 | 8.0 | — | 17.8 | 342 | 18 | X | X X |
| COMPARATIVE EXAMPLE5 | 57.8 | 17.3 | 2.6 | — | 22.3 | 300 | 65 | Δ | Δ |
| COMPARATIVE EXAMPLE6 | 57.8 | 17.3 | 2.6 | 0.033 | 22.3 | 120 | 20 | Δ | X |
| COMPARATIVE EXAMPLE7 | 55.8 | 19.1 | 2.4 | — | 22.7 | 282 | 45 | X | X |

What is claimed is:

1. An etching liquid composition capable of etching a metal film on a substrate, said etching liquid composition being a water solution consisting of phosphoric acid, nitric acid, and an organic acid salt, wherein:
   the concentration of said phosphoric acid in said etching liquid composition is 30% to 80% by weight;
   the concentration of said nitric acid in said etching liquid composition is 1% to 40% by weight;
   the concentration of said organic acid salt in said etching liquid composition is 0.1% to 20% by weight; and
   the total concentration of said phosphoric acid, nitric acid, organic acid salt and water in said etching liquid composition is 100% by weight, wherein
   an organic acid of said organic acid salt is one member selected from the group consisting of an aliphatic monocarboxylic acid, an aliphatic polycarboxylic acid, an aliphatic oxycarboxylic acid, an aromatic monocarboxylic acid, an aromatic polycarboxylic acid, and an aromatic oxycarboxylic acid, and wherein a salt of said organic acid salt is one member selected from the group consisting of an ammonium salt, an amine salt, a quaternary ammonium salt, and an alkali metal salt.

2. The etching liquid composition according to claim 1, capable of etching an aluminum or aluminum alloy.

\* \* \* \* \*